(12) United States Patent
Liaw (10) Patent No.: US 11,682,672 B2
(45) Date of Patent: Jun. 20, 2023

(54) SEMICONDUCTOR DEVICE AND METHOD FOR FORMING THE SAME

(71) Applicant: TAIWAN SEMICONDUCTOR MANUFACTURING CO., LTD., Hsinchu (TW)

(72) Inventor: Jhon-Jhy Liaw, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 165 days.

(21) Appl. No.: 17/200,272

(22) Filed: Mar. 12, 2021

(65) Prior Publication Data
US 2021/0202483 A1    Jul. 1, 2021

Related U.S. Application Data

(63) Continuation of application No. 15/492,059, filed on Apr. 20, 2017, now Pat. No. 10,950,605.

(60) Provisional application No. 62/475,914, filed on Mar. 24, 2017.

(51) Int. Cl.
   *H01L 29/78*     (2006.01)
   *H01L 27/092*    (2006.01)
   *H01L 29/417*    (2006.01)

(52) U.S. Cl.
   CPC .... *H01L 27/0924* (2013.01); *H01L 29/41791* (2013.01); *H01L 29/785* (2013.01)

(58) Field of Classification Search
   CPC ............. H01L 29/41791; H01L 29/785; H01L 27/0924
   See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | Ce et al. |
| 9,236,300 B2 | 1/2016 | Liaw |
| 9,520,482 B1 | 12/2016 | Chang et al. |
| 9,576,814 B2 | 2/2017 | Wu et al. |
| 2006/0273385 A1 | 12/2006 | Hshieh |
| 2007/0235765 A1 | 10/2007 | Liaw |
| 2008/0116496 A1 | 5/2008 | Tzeng et al. |
| 2012/0132986 A1 | 5/2012 | Kang et al. |

(Continued)

*Primary Examiner* — Timor Karimy
(74) *Attorney, Agent, or Firm* — Maschoff Brennan (57) ABSTRACT

A semiconductor device includes a substrate, a semiconductor fin, a gate structure, a source structure, a drain structure, a source contact, and a drain contact. The semiconductor fin extends upwardly from the substrate. The gate structure extends across the semiconductor fin. The source structure is on the semiconductor fin. The drain structure is on the semiconductor fin, in which the source and drain structures are respectively on opposite sides of the gate structure in a plan view. The source contact lands on the source structure and forms a rectangular pattern in the plan view. The drain contact lands on the drain structure and forms a circular pattern in the plan view, in which the rectangular pattern of the source contact has a length greater than a longest dimension of the circular pattern of the drain contact.

20 Claims, 10 Drawing Sheets

(56) References Cited

U.S. PATENT DOCUMENTS

2014/0153321 A1 6/2014 Liaw
2015/0003502 A1 1/2015 Menkhoff

SEMICONDUCTOR DEVICE AND METHOD FOR FORMING THE SAME

RELATED APPLICATIONS

The present application is a continuation application of U.S. application Ser. No. 15/492,059, filed Apr. 20, 2017, now U.S. Pat. No. 10,950,605, issued Mar. 16, 2021, which claims priority to U.S. Provisional Application Ser. No. 62/475,914, filed Mar. 24, 2017, which is herein incorporated by reference in their entirety.

BACKGROUND

With the advance of science and technology, a semiconductor device becomes more and more small. The gate pitch (spacing) in the semiconductor devices is continuous shrunk and therefore induced contact to gate bridge concern. Fin field effect transistors (FinFET) required narrow fin width for short channel control and therefore resulted smaller top S/D regions than planar transistors. This will further degrade the contact to S/D landing margin and contact resistance. To solve this issue, the longer contact layout was proposed for 32 nm and beyond technologies. But area impact and worse gate to contact capacitance are major concerns.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

To continue shrink both STD cell (i.e., an inverter, a NAND, a NOR circuit) and static random-access memory (SRAM) cell and have better cell performance, the present disclosure proposed contact structures to have both lower source node contact resistance as well as low capacitance on drain node (or cell bit line node) to meet both high density and high speed system-on-chip (SOC) product requirements, which is described below.

Figure 1:
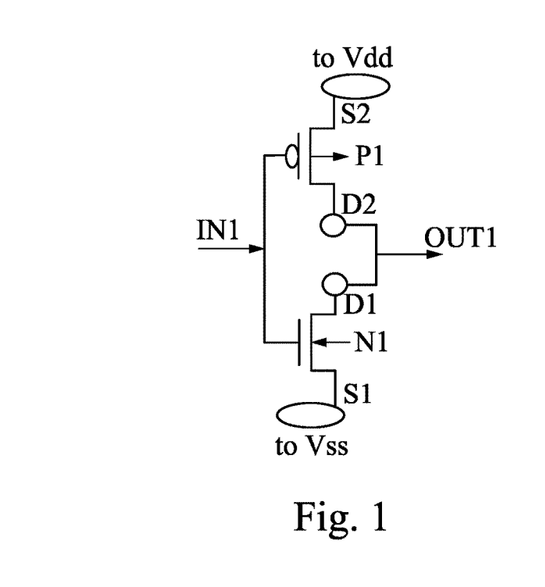
FIG. 1 is a diagram of a semiconductor device, in accordance with various embodiments.
Figure 2:
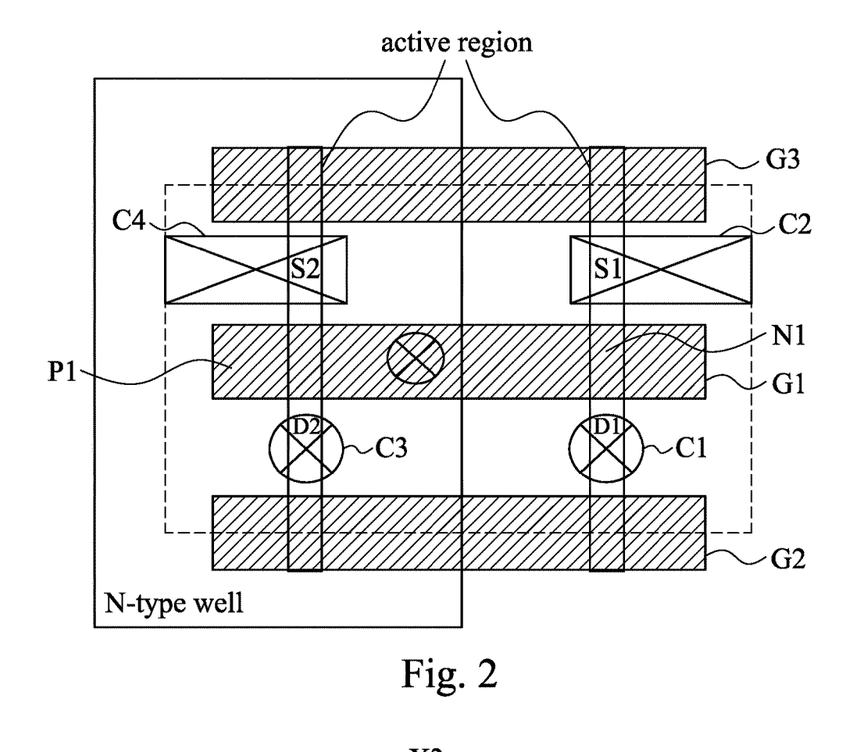
FIG. 2 is a top view of the semiconductor device in FIG. 1, in accordance with various embodiments.

Reference is now made to FIGS. 1 and 2. FIG. 1 is a diagram of a semiconductor device, in accordance with various embodiments. FIG. 2 is a top view of the semiconductor device in FIG. 1, in accordance with various embodiments. As illustrated in both FIGS. 1 and 2, the semiconductor device includes a first transistor N1 and a second transistor P1. The first transistor N1 includes a first terminal D1, a first contact C1, a second terminal S1, and a second contact C2. The first contact C1 is electrically connected to the first terminal D1, and the shape of the first contact C1 is circular. The second contact C2 is electrically connected to the second terminal S1 and a ground terminal Vss, and the shape of the second contact C2 is rectangular. However, the scope of the disclosure is not intended to be limited in the shape of the contacts, and other suitable shapes of the contacts are within the contemplated scope of the present disclosure. In some embodiments, the first contact C1 is directly connected to the first terminal D1 of the first transistor N1, and the second contact C2 is directly connected to the second terminal S1 of the first transistor N1.

As illustrated in both FIGS. 1 and 2, the second transistor P1 includes a first terminal D2, a first contact C3, a second terminal S2, a second contact C4, and a control terminal. The first contact C3 is electrically connected to the first terminal D2, and the shape of the first contact C3 is circular. The second contact C4 is electrically connected to the second terminal S2 and a power source Vdd, and the shape of the second contact C4 is rectangular. However, the scope of the disclosure is not intended to be limited in the shape of the contacts, and other suitable shapes of the contacts are within the contemplated scope of the present disclosure. In various embodiments, the control terminal of the second transistor P1 is electrically connected to a control terminal of the first transistor N1. In some embodiments, the semiconductor device in FIGS. 1-2 is, for example, a Complementary Metal-Oxide-Semiconductor (CMOS). In various embodiments, the first contact C3 is directly connected to the first terminal D2 of the second transistor P1, and the second contact C4 is directly connected to the second terminal S2 of the second transistor P1.

In various embodiments, the first transistor N1 and the second transistor P1 are, for example, single fin-line fin field effect transistors (FET). The first transistor N1 is, for example, single fin-line N-type FinFET, and the second transistor P1 is, for example, single fin-line P-type FinFET. In some embodiments, the first terminal D1 of the first transistor N1 and the first terminal D2 of the second transistor P1 are drains. The second terminal S1 of the first transistor N1 and the second terminal S2 of the second transistor P1 are sources. In some embodiments, the source and the drain of the P-type FinFET P1 comprise epi profile selected from the group consisting of SiGe, SiGeC, Ge, Si, and combinations thereof. In various embodiments, the source and the drain of the N-type FinFET N1 comprises epi profile selected from the group consisting of SiP content, SiC content, SiPC, SiAs, Si, and combinations thereof. In some embodiments, the transistors are FinFET structure and selected from the group consisting of 2D-finFET structure, 3D-finFET structure, and combinations thereof. In various embodiments, the structure of the gate electrodes in FIGS. 1 and 2 comprise multiple material structure selected from the group consisting of poly gate/SiON structure, metals/high-K dielectric structure, Al/refractory metals/high-K dielectric structure, silicide/high-K dielectric structure, and combinations thereof.

As mentioned above, COMSFET is composited by single fin-line FinFET transistors, circular shape contact is used for the drain node of CMOSFET, and rectangular shape contact is used for the source node CMSOFET; and therefore, the semiconductor device (i.e., CMSOFET) of the present disclosure have both lower source node contact resistance as well as low capacitance on drain node so as to meet both high density and high speed SOC product requirements.

Figure 3:
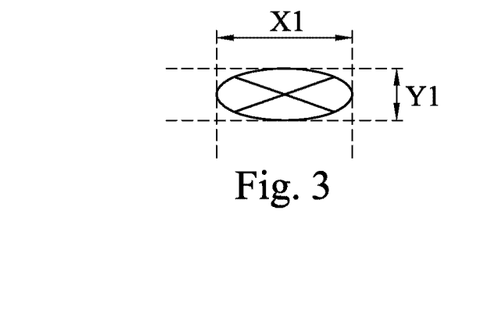
FIG. 3 is a diagram of a contact of the semiconductor device in FIG. 1, in accordance with various embodiments.
Figure 4:
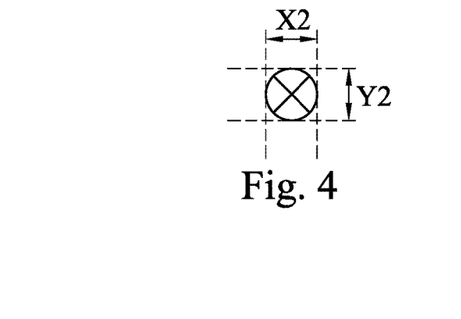
FIG. 4 is a diagram of a contact of the semiconductor device in FIG. 1, in accordance with various embodiments.

Reference is now made to FIGS. 3 and 4. FIGS. 3 and 4 are diagrams of contacts of the semiconductor device in FIG. 1, in accordance with various embodiments. As illustrated in FIG. 3, it shows the ratio of the rectangle. The rectangles of the contacts C2 and C4 include lengths and widths, and the ratio of the length and the width is larger than 3. As illustrated in FIG. 4, it shows the ratio of the circle. The circles of the contacts C1 and C3 include major axis and minor axis, and the ratio of the major axis and the minor axis is less than 1.2. Explain in a different way, the length ratio of longer side and short side of each of the circles of the contacts C1 and C3 is less than 1.2. In some embodiments, the ratio of the major axis and the minor axis is about 0.8 to 1.2. Explain in a different way, the length ratio of longer side and short side of each of the circles of the contacts C1 and C3 is about 0.8 to 1.2. However, the scope of the disclosure is not intended to be limited in the ratio, and other suitable ratio is within the contemplated scope of the present disclosure.

Figure 5:
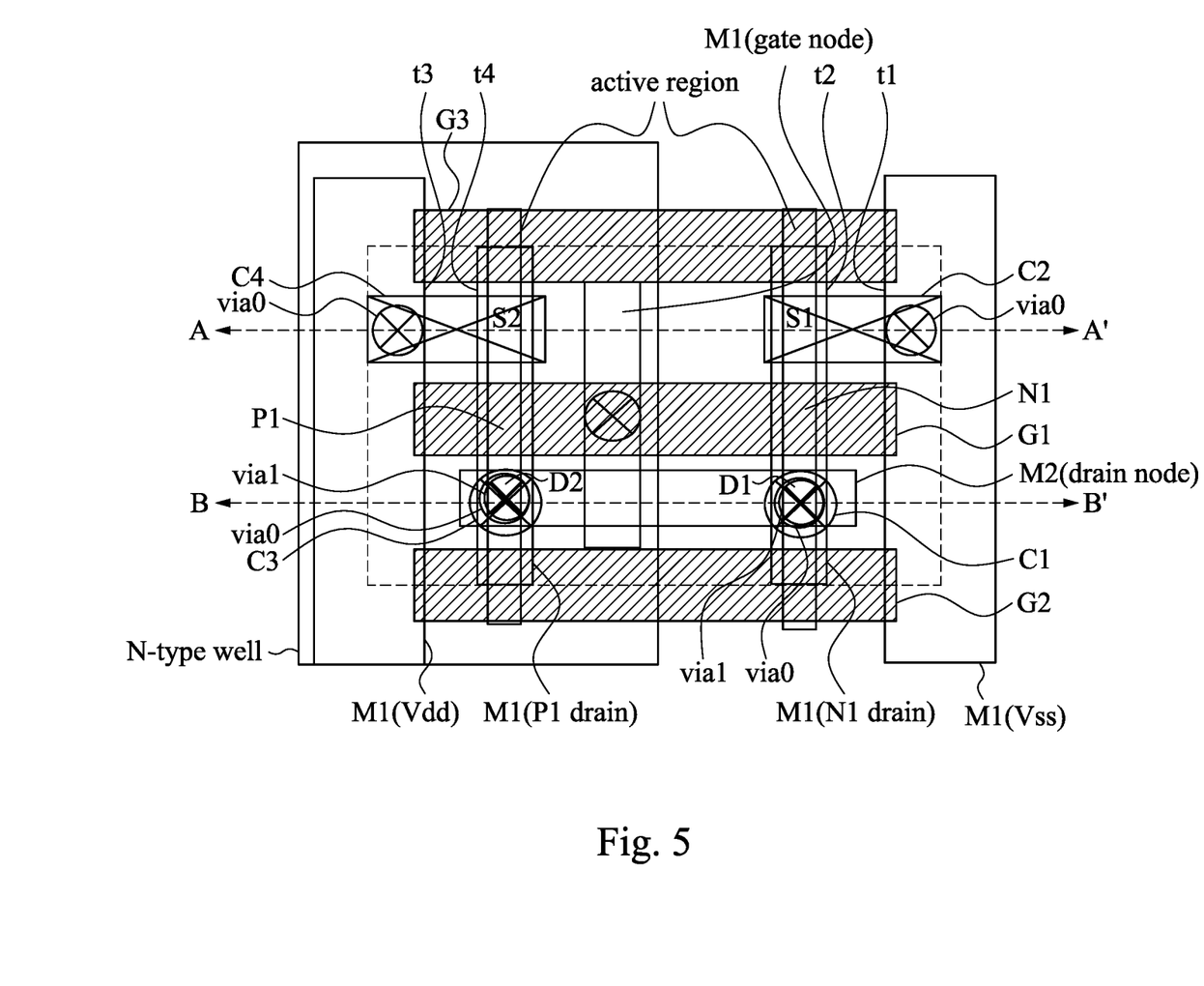
FIG. 5 is a top view of the semiconductor device in FIG. 1, in accordance with various embodiments.
Figure 6:
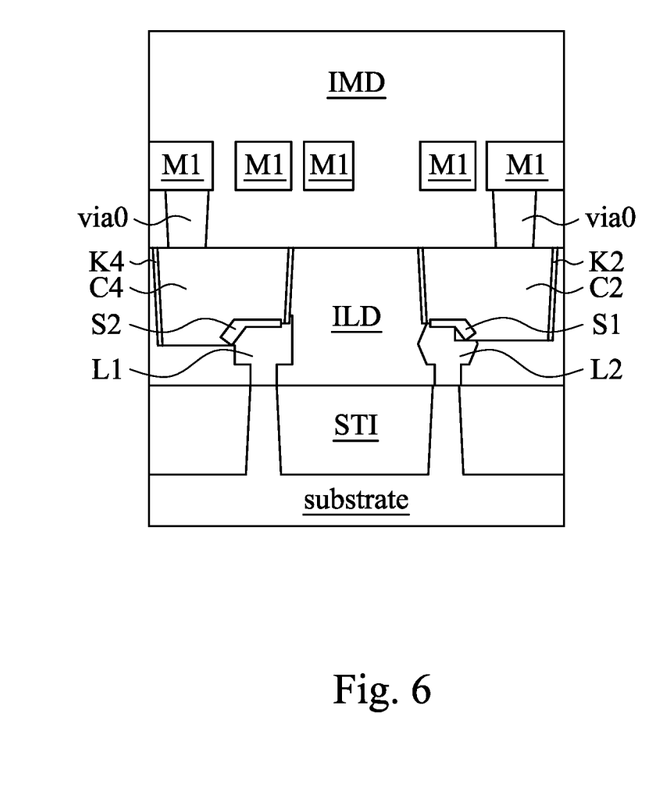
FIG. 6 is a cross-sectional view of the semiconductor device in FIG. 5, in accordance with various embodiments.
Figure 7:
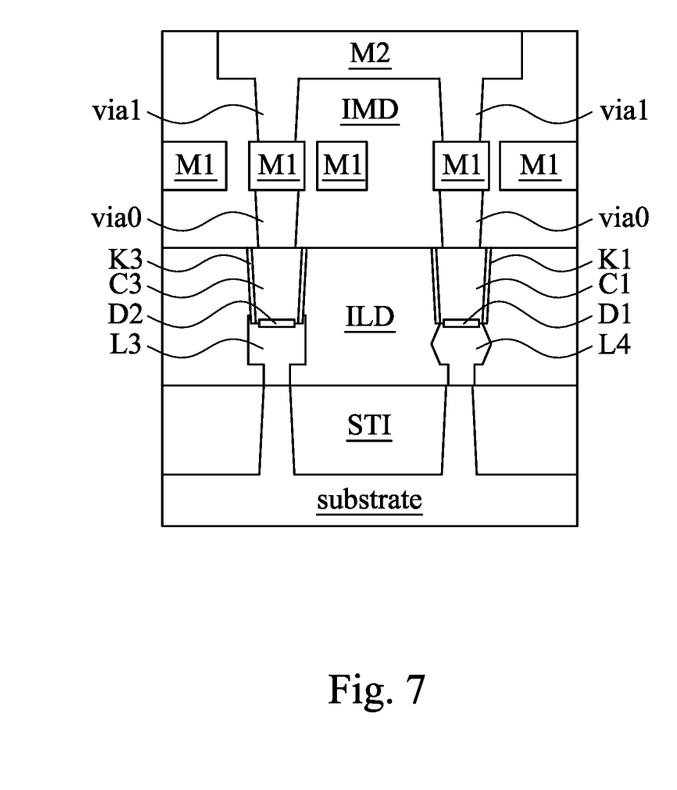
FIG. 7 is a cross-sectional view of the semiconductor device in FIG. 5, in accordance with various embodiments.

Reference is now made to FIG. 5. FIG. 5 is a top view of the semiconductor device in FIG. 1, in accordance with various embodiments. In contrast to the semiconductor device in FIG. 2, the semiconductor device in FIG. 5 further illustrates metal M1 and via 0, 1. For facilitating the understanding of the semiconductor device in FIG. 5, reference is made to both FIGS. 6 and 7. FIG. 6 is a cross-sectional view through line AA' of the semiconductor device in FIG. 5, in accordance with various embodiments. FIG. 7 is a cross-sectional view through line BB' of the semiconductor device in FIG. 5, in accordance with various embodiments.

As illustrated in both FIGS. 5 and 6, the semiconductor device includes a substrate, a shallow trench isolation (STI), a dielectric layer (ILD), a layer L1, a layer L2, a layer S1, a layer S2, a second contact C2, a fourth contact C4, a high-K dielectric layer K2, a high-K dielectric layer K4, via0, metal layers M1(Vss), M1(Vdd), M1(N1 drain), and M1(P1 drain), an inter-metal dielectric (IMD), a gate G1, and dummy gates (or isolation gates) G2, G3. The STI is disposed on the substrate, the ILD is disposed on the STI, and the IMD is disposed on the ILD. The layer L1 and the layer L2 are disposed inside the ILD. The layer S1 is connected between the layer L1 and the fourth contact C4, and the layer S2 is connected between the layer L2 and the second contact C2. The high-K dielectric layer K2 is disposed around the sidewall of the second contact C2, and the high-K dielectric layer K4 is disposed around the sidewall of the fourth contact C4. The high-K dielectric layer K2 is disposed between the second contact C2 and the ILD, and the high-K dielectric layer K4 is disposed between the fourth contact C4 and the ILD. The second contact C2 is connected to the metal layer M1(Vss) which is electrically connect to Vss through the via 0, and the fourth contact C4 is connected to the metal layer M1(Vdd) which is electrically connect to Vdd through the via 0. The metal layer M1(Vss), M1(Vdd), M1(N1 drain), and M1(P1 drain) and the via 0 are disposed inside the IMD. In FIG. 5, the second contact C2 extends past a longitudinal side t1 of the metal layer M1(Vss) and a longitudinal side t2 of the metal layer M1(N1 drain), and the fourth contact C4 extends past a longitudinal side t3 of the metal layer M1(Vdd) and a longitudinal side t4 of the metal layer M1(P1 drain).

In some embodiments, the material of the substrate of the semiconductor device are selected from the group consisting of bulk-Si, SiP, SiGe, SiC, SiPC, Ge, SOI-Si, SOI-SiGe, III-VI material, and combinations thereof. The layer L1 is, for example, a SiGe epi layer, and the layer L2 is, for example, a SiP epi layer. The layers S1 and S2 are, for example, silicide. The second contact C2 and the fourth contact C4 are, for example, multiple metal material composition, and said materials are selected from the group consisting of Ti, TiN, TaN, Co, W, Al, Cu, and combinations thereof. In various embodiments, the thickness of each of the high-K dielectric layers K2 and K4 is about 5 to 30 Å. In some embodiments, the material of each of the high-K dielectric layers K2 and K4 is Si3N4, or nitride-base dielectric. In various embodiments, the material of each of the high-K dielectric layers K2 and K4 is selected from the group consisting of nitride base dielectric, metal oxide dielectric, Hf oxide, Ta oxide, Ti oxide, Zr oxide, Al oxide, and combinations thereof.

As illustrated in both FIGS. 5 and 7, the semiconductor device includes a substrate, a STI, an ILD, a layer L3, a layer L4, a layer S3, a layer S4, a first contact C1, a third contact C3, a high-K dielectric layer K1, a high-K dielectric layer K3, via0, via 1, metal layers M1(N1 drain), and M1(P1 drain), an IMD, a metal layer M2, a gate G1, and dummy gates (or isolation gates) G2, G3. The STI is disposed on the substrate, the ILD is disposed on the STI, and the IMD is disposed on the ILD. The layer L3 and the layer L4 are disposed inside the ILD. The layer S3 is connected between the layer L3 and the third contact C3, and the layer S4 is connected between the layer L4 and the first contact C1. The high-K dielectric layer K1 is disposed around the sidewall of the first contact C1, and the high-K dielectric layer K3 is disposed around the sidewall of the third contact C3. The high-K dielectric layer K1 is disposed between the first contact C1 and the ILD, and the high-K dielectric layer K3 is disposed between the third contact C3 and the ILD. The first contact C1 is connected to the metal layer M1(N1 drain) which is electrically connect to N1 drain through the via 0, and the third contact C3 is connected to the metal layer M1(P1 drain) which is electrically connect to P1 drain through the via 0. The metal layers M1(N1 drain) and M1(P1 drain) and the via 0 are disposed inside the IMD. The metal layer M2 shown in FIG. 7 which is a drain node is connected to the metal layers M1(N1 drain) and M1(P1 drain) through via 1.

In some embodiments, the material of the substrate of the semiconductor device are selected from the group consisting of bulk-Si, SiP, SiGe, SiC, SiPC, Ge, SOI-Si, SOI-SiGe, III-VI material, and combinations thereof. The layer L3 is, for example, a SiGe epi layer, and the layer L4 is, for example, a SiP epi layer. The layers S3 and S4 are, for example, silicide. The first contact C1 and the third contact C3 are, for example, multiple metal material composition, and said materials are selected from the group consisting of Ti, TiN, TaN, Co, W, Al, Cu, and combinations thereof. In various embodiments, the thickness of each of the high-K dielectric layers K1 and K3 is about 5 to 30 Å. In some embodiments, the material of each of the high-K dielectric layers K1 and K3 is Si3N4, or nitride-base dielectric. In various embodiments, the material of each of the high-K dielectric layers K1 and K3 is selected from the group consisting of nitride base dielectric, metal oxide dielectric, Hf oxide, Ta oxide, Ti oxide, Zr oxide, Al oxide, and combinations thereof.

Figure 8:
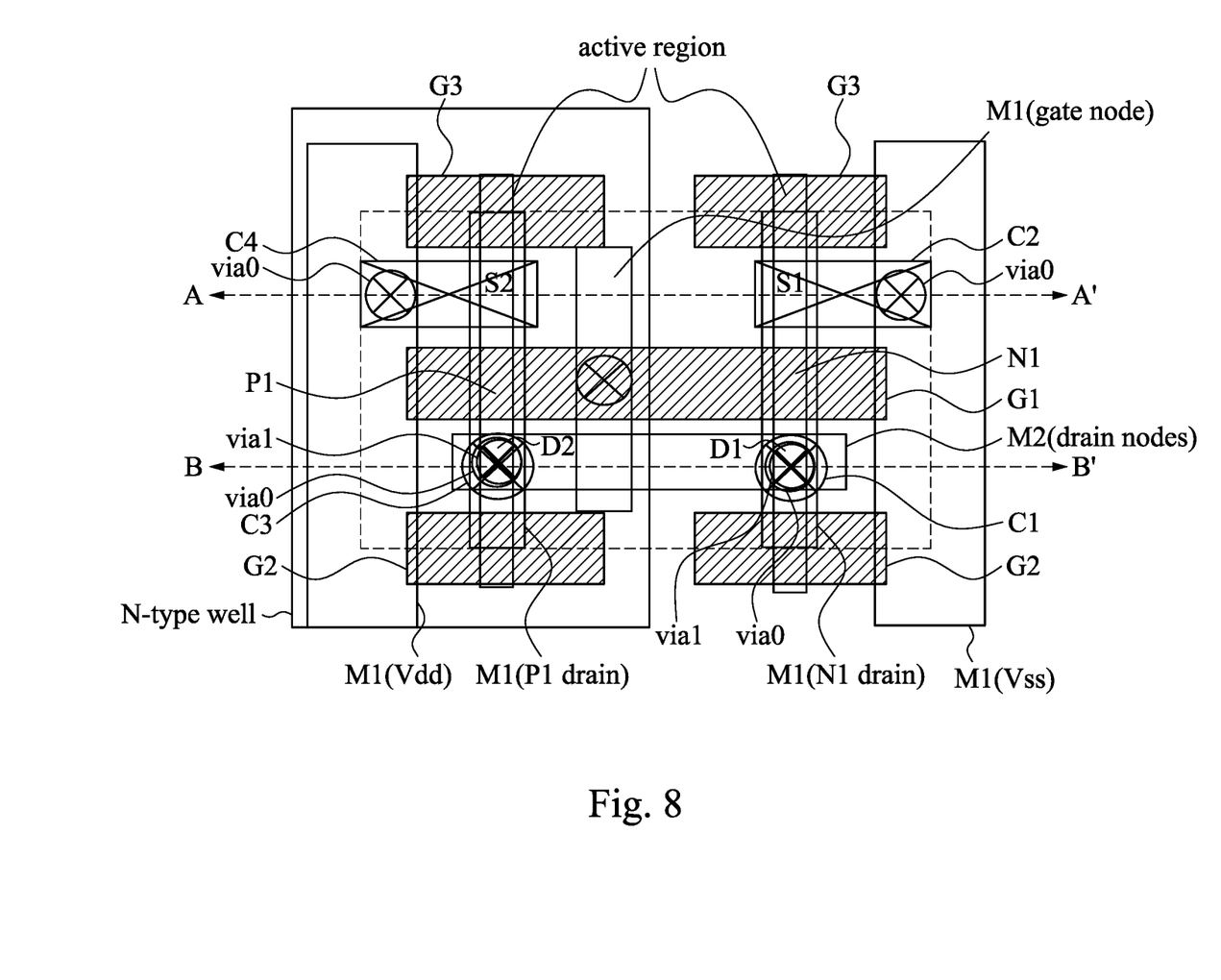
FIG. 8 is a top view of the semiconductor device in FIG. 1, in accordance with various embodiments.

Reference is now made to FIG. 8. FIG. 8 is a top view of the semiconductor device in FIG. 1, in accordance with various embodiments. In contrast to the semiconductor device in FIG. 5, the dummy gates (or isolation gates) G2, G3 of the semiconductor device in FIG. 8 are separated into two portions. Explained in a different way, each of the dummy gates (or isolation gates) G2, G3 has two portions which are not connected to each other.

Figure 9:
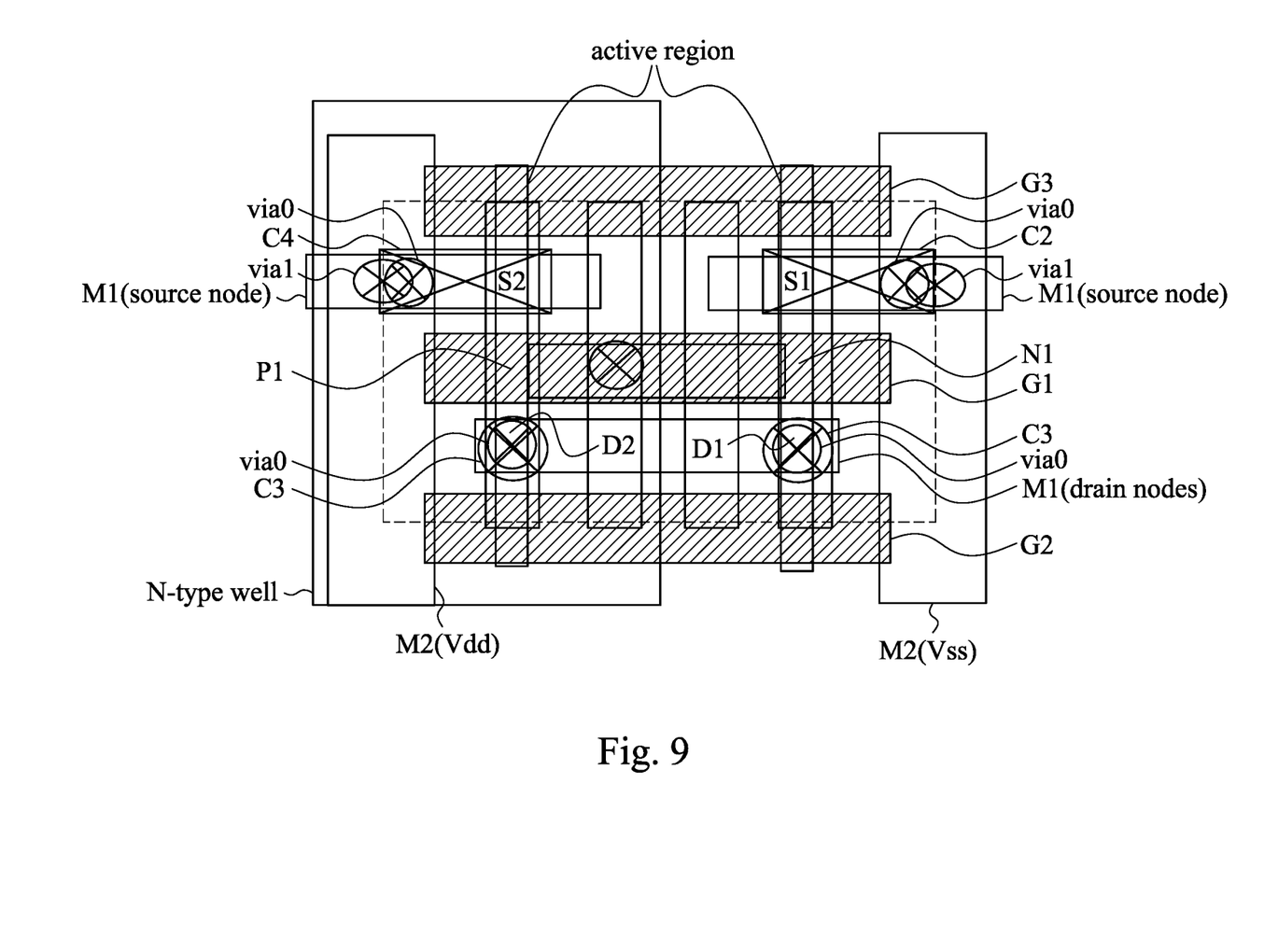
FIG. 9 is a top view of the semiconductor device in FIG. 1, in accordance with various embodiments.

Reference is now made to FIG. 9. FIG. 9 is a top view of the semiconductor device in FIG. 1, in accordance with various embodiments. In contrast to the semiconductor device in FIG. 5, the second terminal S1 of the first transistor N1 is electrically connected to the metal layer M2 which is electrically connected to Vss, and the second terminal S2 of the second transistor P1 is electrically connected to the metal layer M2 which is electrically connect to Vdd. In some embodiments, the second terminal S1 of the first transistors N1 is electrically connected to the metal layer M1 through the via 0, and the metal layer M1 is electrically connected to the metal layer M2 which is electrically connected to Vss through the via 1. The second terminal S2 of the second transistors P1 is electrically connected to the metal layer M1 through the via 0, and the metal layer M1 is electrically connected to the metal layer M2 which is electrically connect to Vdd through the via 1.

Figure 10:
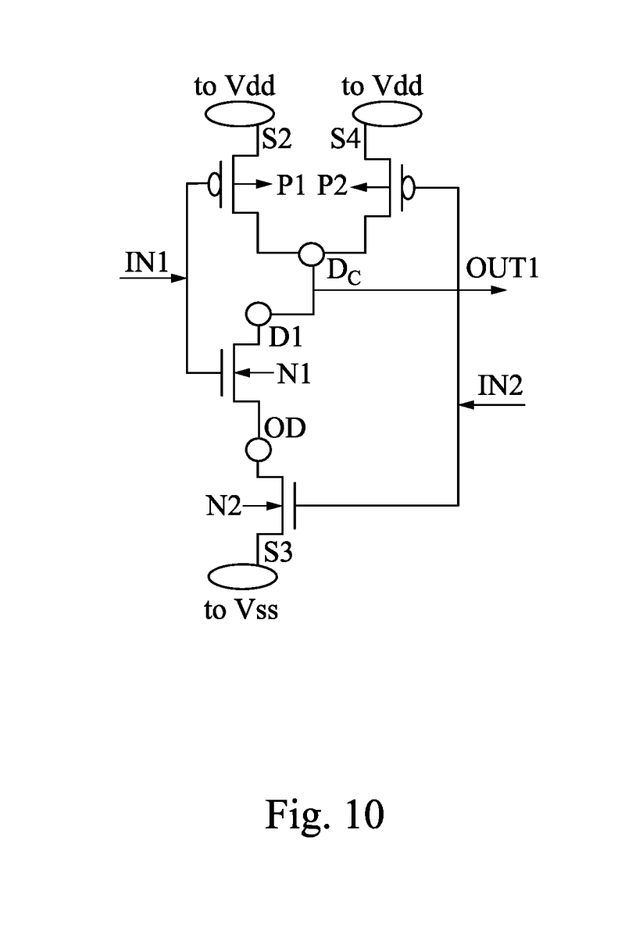
FIG. 10 is a diagram of a semiconductor device, in accordance with various embodiments.
Figure 11:
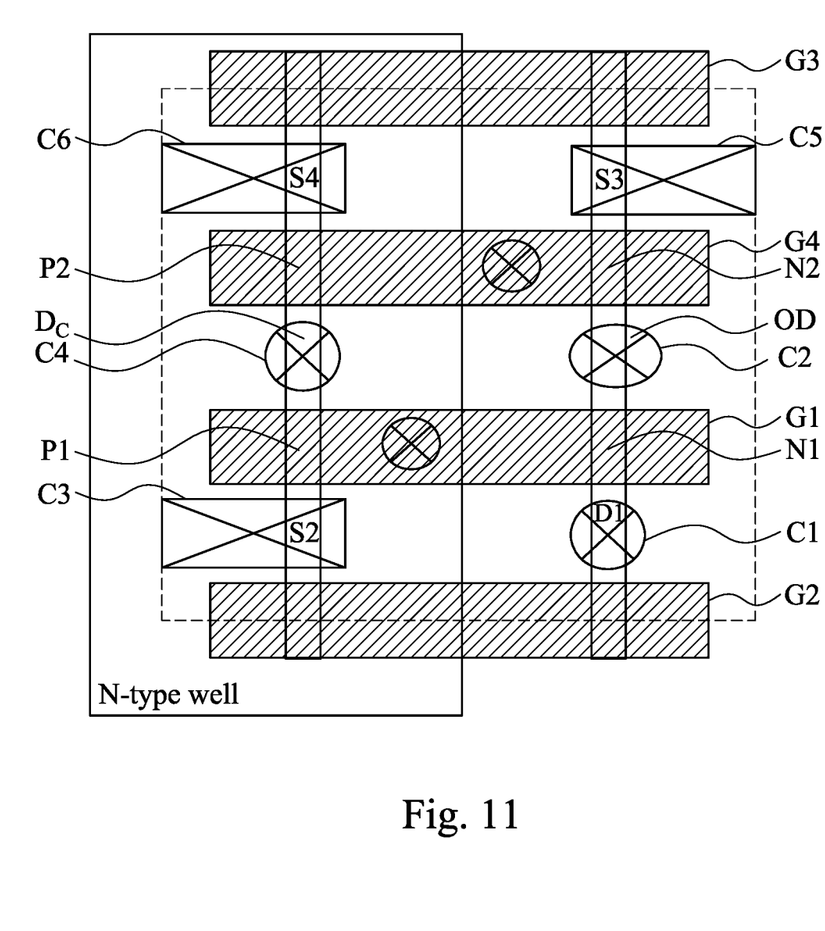
FIG. 11 is a top view of the semiconductor device in FIG. 10, in accordance with various embodiments.

Reference is now made to FIGS. 10 and 11. FIG. 10 is a diagram of a semiconductor device, in accordance with various embodiments. FIG. 11 is a top view of the semiconductor device in FIG. 10, in accordance with various embodiments. In contrast to the semiconductor device in FIG. 1, the semiconductor device in FIGS. 10 and 11 further includes a third transistor P2 and a fourth transistor N2. The third transistor P2 includes a first terminal Dc and a first contact C4, a second terminal S4, and a second contact C6. The fourth transistor N2 includes a first terminal OD and a first contact C2, a second terminal S3, a second contact C5, and a control terminal. The first contact C4 of the third transistor P2 is electrically connected to the first terminal Dc of the second transistor P1 and the first terminal D1 of the first transistor N1, and the shape of the first contact C4 of the third transistor P2 is circular. The second contact C6 of the third transistor P2 is electrically connected to the second terminal S4 and the power source Vdd, and the shape of the second contact C6 is rectangular.

In some embodiments, the first contact C2 of the fourth transistor N2 is electrically connected to the first terminal OD of the fourth transistor N2. The first contact C2 of the fourth transistor N2 is electrically connected to the second terminal OD of the first transistor N1, and the shape of the first contact C2 of the fourth transistor N2 is circular. The second contact C5 of the fourth transistor N2 is electrically connected to the second terminal S3 of the fourth transistor N2 and the ground terminal Vss, and the shape of the second contact C5 is rectangular. The control terminal of the fourth transistor N2 is electrically connected to a control terminal of the third transistor P2. However, the scope of the disclosure is not intended to be limited in the shape of the contacts, and other suitable shapes of the contacts are within the contemplated scope of the present disclosure. In some embodiments, the semiconductor device in FIGS. 10~11 is, for example, a NAND.

In various embodiments, the first contact C4 of the third transistor P2 is directly connected to the first terminal Dc of the second transistor P1 and the first terminal D1 of the first transistor N1. The second contact C6 of the third transistor P2 is directly connected to the second terminal S4 of the third transistor P2, and electrically connected the power source Vdd. In various embodiments, the third transistor P2 and the fourth transistor N2 are, for example, single fin-line fin field effect transistors (FET). The third transistor P2 is, for example, single fin-line P-type FinFET, and the fourth transistor N2 is, for example, single fin-line N-type FinFET. In some embodiments, the first terminal Dc of the third transistor P2 and the first terminal OD of the fourth transistor N2 are drains. The second terminal S4 of the third transistor P2 and the second terminal S3 of the fourth transistor N2 are sources. In some embodiments, the source and the drain of the P-type FinFET P2 comprise epi profile selected from the group consisting of SiGe, SiGeC, Ge, Si, and combinations thereof. In various embodiments, the source and the drain of the N-type FinFET N2 comprises epi profile selected from the group consisting of SiP content, SiC content, SiPC, SiAs, S1, and combinations thereof. In some embodiments, the transistors are FinFET structure and selected from the group consisting of 2D-finFET structure, 3D-finFET structure, and combinations thereof. In various embodiments, the structure of the gate electrodes in FIGS. 10 and 11 comprise multiple material structure selected from the group consisting of poly gate/SiON structure, metals/high-K dielectric structure, Al/refractory metals/high-K dielectric structure, silicide/high-K dielectric structure, and combinations thereof.

Figure 12:
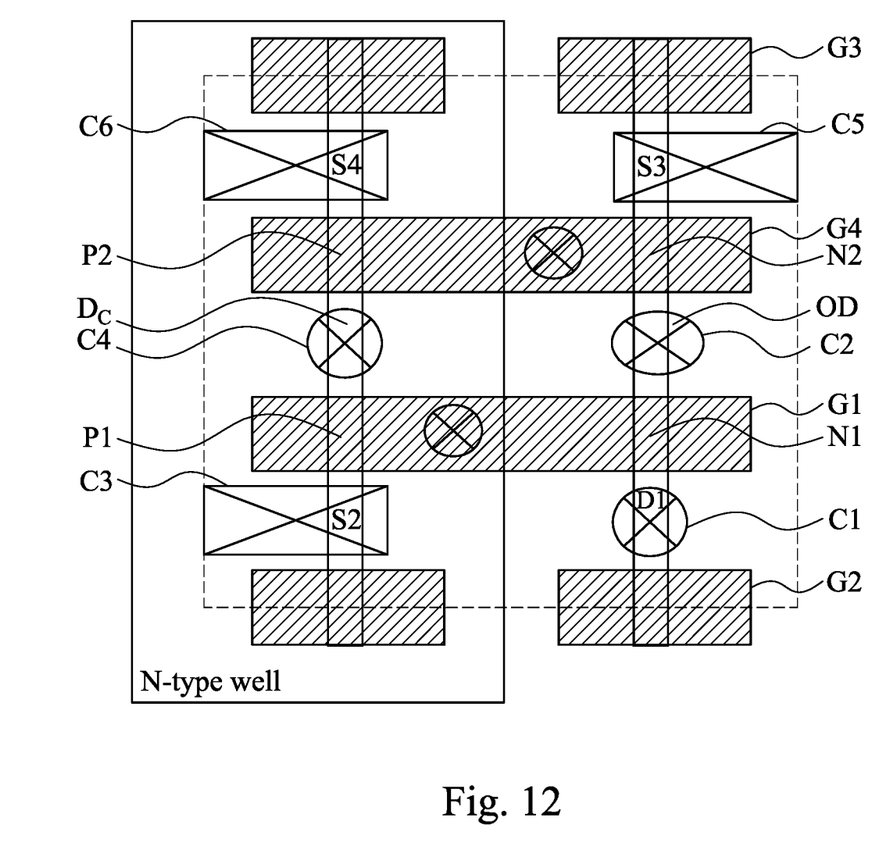
FIG. 12 is a top view of the semiconductor device in FIG. 10, in accordance with various embodiments.

Reference is now made to FIG. 12. FIG. 12 is a top view of the semiconductor device in FIG. 10, in accordance with various embodiments. In contrast to the semiconductor device in FIG. 11, the dummy gates (or isolation gates) G2, G3 of the semiconductor device in FIG. 12 are separated into two portions. Explained in a different way, each of the dummy gates (or isolation gates) G2, G3 has two portions which are not connected to each other.

Figure 13:
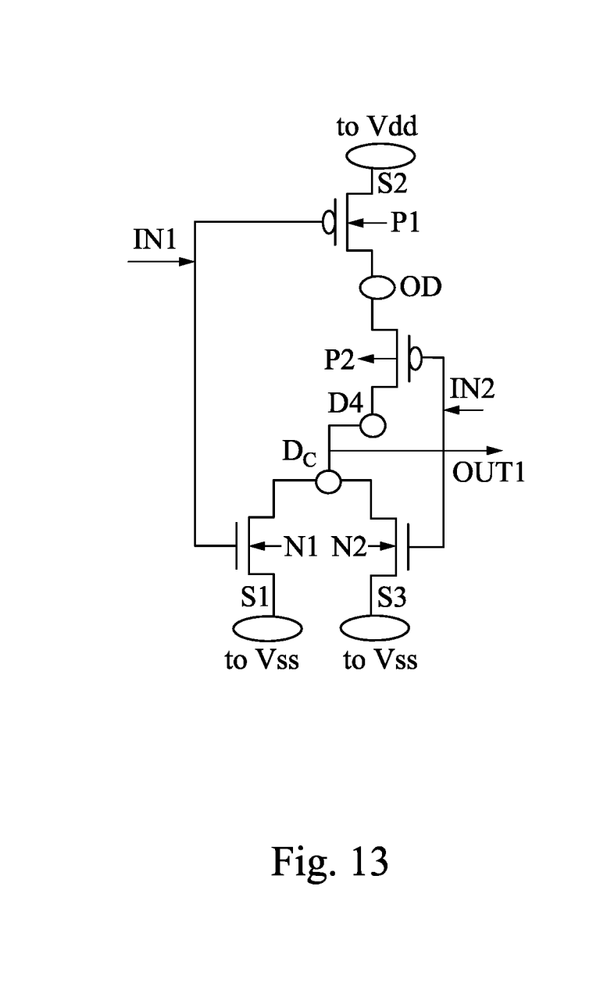
FIG. 13 is a diagram of a semiconductor device, in accordance with various embodiments.
Figure 14:
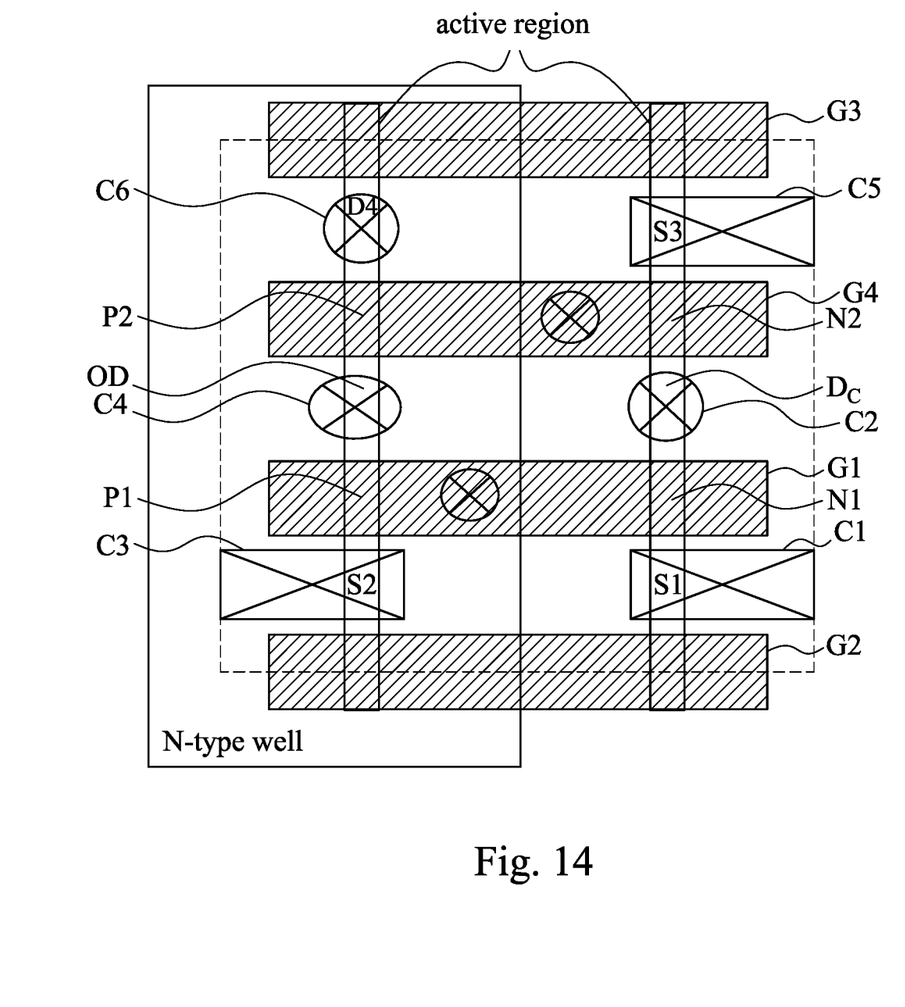
FIG. 14 is a top view of the semiconductor device in FIG. 13, in accordance with various embodiments.

Reference is now made to both FIGS. 13 and 14. FIG. 13 is a diagram of a semiconductor device, in accordance with various embodiments. FIG. 14 is a top view of the semiconductor device in FIG. 13, in accordance with various embodiments. In contrast to the semiconductor device in FIG. 1, the semiconductor device in FIGS. 13 and 14 further includes a third transistor P2 and a fourth transistor N2. The third transistor P2 includes a first terminal D4 and a first contact C6, a second terminal OD, and a second contact C4. The fourth transistor N2 includes a first terminal Dc and a first contact C2, a second terminal S3, a second contact C5, and a control terminal. The first contact C6 of the third transistor P2 is electrically connected to the first terminal D4 of the third transistor P2. The first terminal D4 of the third transistor P2 is electrically connected to the first terminal DC of the first transistor N1, and the shape of the first contact C6 of the third transistor P2 is circular. The second contact C4 of the third transistor P2 is electrically connected to the second terminal OD of the third transistor P2, and the second contact C4 of the third transistor P2 is electrically connected to the first terminal OD of the second transistor P1, and the shape of the second contact C4 of the third transistor P2 is rectangular.

In some embodiments, the first contact C2 of the fourth transistor N2 is electrically connected to the first terminal Dc of the fourth transistor N2. The first contact C2 of the fourth transistor N2 is electrically connected to the first terminal Dc of the first transistor N1, and the shape of the first contact C2 of the fourth transistor N2 is circular. The second contact C5 of the fourth transistor N2 is electrically connected to the second terminal S3 of fourth transistor N2 and the ground terminal Vss, and the shape of the second contact C5 is rectangular. The control terminal of the fourth transistor N2 is electrically connected to a control terminal of the third transistor P2. However, the scope of the disclosure is not intended to be limited in the shape of the contacts, and other suitable shapes of the contacts are within the contemplated scope of the present disclosure. In some embodiments, the semiconductor device in FIGS. 13~14 is, for example, a NOR.

In various embodiments, the second contact C4 of the third transistor P2 is directly connected to the second terminal OD of the third transistor P2, and the second contact C4 of the third transistor P2 is directly connected to the first terminal OD of the second transistor P1. The first contact C2 of the fourth transistor N2 is directly connected to the first terminal Dc of the fourth transistor N2, and the first contact C2 of the fourth transistor N2 is directly connected to the first terminal Dc of the first transistor N1.

The second contact C5 of the fourth transistor N2 is directly connected to the second terminal S3 of fourth transistor N2, and electrically connected the ground terminal Vss. In various embodiments, the third transistor P2 and the fourth transistor N2 are, for example, single fin-line fin field effect transistors (FET). The third transistor P2 is, for example, single fin-line P-type FinFET, and the fourth transistor N2 is, for example, single fin-line N-type FinFET. In some embodiments, the first terminal D4 of the third transistor P2 and the first terminal Dc of the fourth transistor N2 are drains. The second terminal OD of the third transistor P2 and the second terminal S3 of the fourth transistor N2 are sources. In some embodiments, the source and the drain of the P-type FinFET P2 comprise epi profile selected from the group consisting of SiGe, SiGeC, Ge, Si, and combinations thereof. In various embodiments, the source and the drain of the N-type FinFET N2 comprises epi profile selected from the group consisting of SiP content, SiC content, SiPC, SiAs, S1, and combinations thereof. In some embodiments, the transistors are FinFET structure and selected from the group consisting of 2D-finFET structure, 3D-finFET structure, and combinations thereof. In various embodiments, the structure of the gate electrodes in FIGS. 13 and 14 comprise multiple material structure selected from the group consisting of poly gate/SiON structure, metals/high-K dielectric structure, Al/refractory metals/high-K dielectric structure, silicide/high-K dielectric structure, and combinations thereof.

Figure 15:
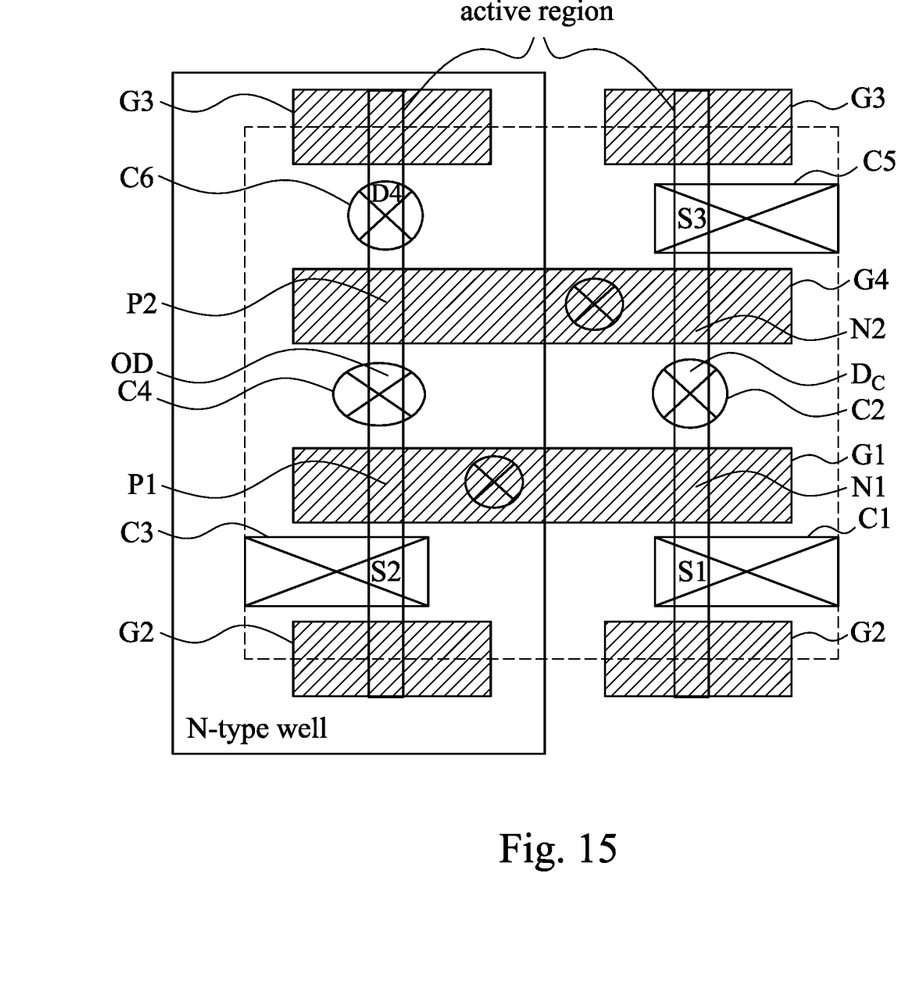
FIG. 15 is a top view of the semiconductor device in FIG. 13, in accordance with various embodiments.

Reference is now made to FIG. 15. FIG. 15 is a top view of the semiconductor device in FIG. 13, in accordance with various embodiments. In contrast to the semiconductor device in FIG. 14, the dummy gates (or isolation gates) G2, G3 of the semiconductor device in FIG. 15 are separated into two portions. Explained in a different way, each of the dummy gates (or isolation gates) G2, G3 has two portions which are not connected to each other.

Figure 16:
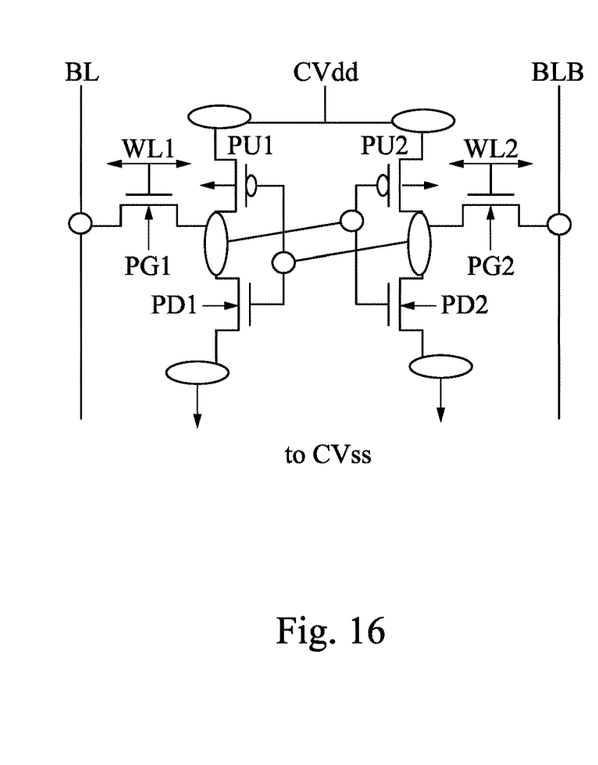
FIG. 16 is a diagram of a semiconductor device, in accordance with various embodiments.
Figure 17:
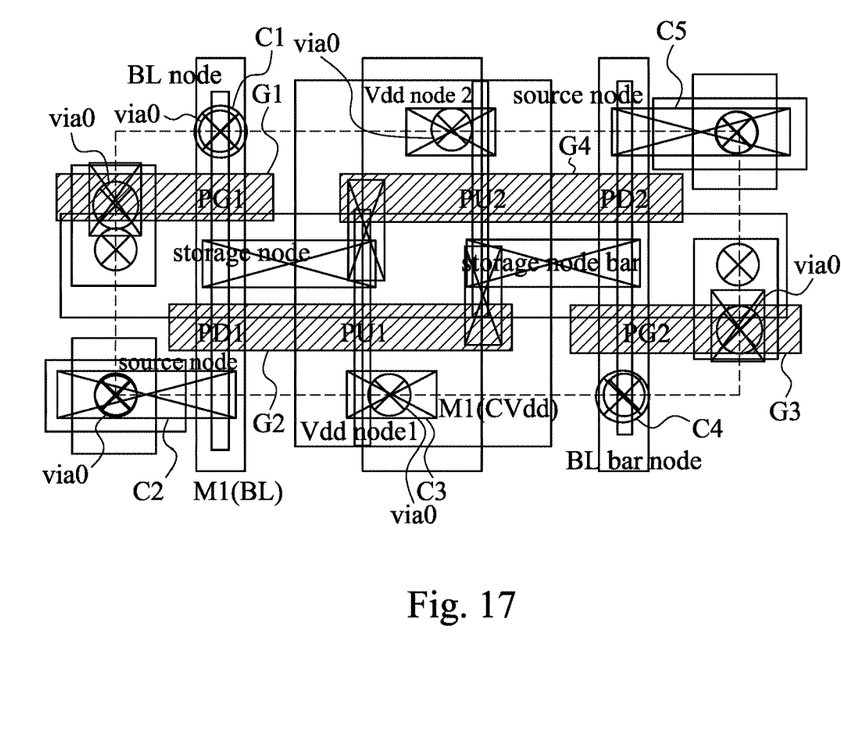
FIG. 17 is a top view of the semiconductor device in FIG. 16, in accordance with various embodiments.

Reference is now made to FIGS. 16 and 17. FIG. 16 is a diagram of a semiconductor device, in accordance with various embodiments. FIG. 17 is a top view of the semiconductor device in FIG. 16, in accordance with various embodiments. As illustrated in both FIGS. 16 and 17, the semiconductor device includes a first transistor PG1 and a second transistor PD1. The first transistor PG1 includes a first terminal, a first contact C1, a second terminal, and a control terminal. The second transistor PD1 includes a first terminal, a second terminal, a second contact C2. The first contact C1 of the first transistor PG1 is electrically connected to the first terminal of the first transistor PG1 and a first bit line BL, and the shape of the first contact C1 is circular. The control terminal of the first transistor PG1 is electrically connected to a first word line WL1. The circle of the first contact C1 of the first transistor PG1 includes major axis and minor axis, and the ratio of the major axis and the minor axis is less than 1.2.

In various embodiments, the first terminal of the second transistor PD1 is electrically connected to the second terminal of the first transistor PG1. The second contact C2 of the second transistor PD1 is electrically connected to the second terminal of the second transistor PD1 and a ground terminal CVss, and the shape of the second contact C2 is rectangular. In some embodiments, the rectangle of the second contact C2 of the second transistor PD1 includes lengths and widths, and the ratio of the length and the width is larger than 3.

In some embodiments, the semiconductor device further includes a third transistor PU1. The third transistor PU1 includes a first terminal, a second terminal, a second contact C3, and a control terminal. The first terminal of the third transistor PU1 is electrically connected to a power source CVdd. The second contact C3 of the third transistor PU1 is electrically connected to the second terminal of the third transistor PU1 and a power source CVdd, and the shape of the second contact C3 is rectangular. The control terminal of the third transistor PU1 is electrically connected to a control terminal of the second transistor PD1. The rectangle of the second contact C3 of the third transistor PU1 includes lengths and widths, and the ratio of the length and the width is larger than 2.

As illustrated in both FIGS. 16 and 17, the semiconductor device further includes a fourth transistor PG2 and a fifth transistor PD2. The fourth transistor PG2 includes a first terminal, a first contact C4, a second terminal, and a control terminal. The fifth transistor PD2 includes a first terminal, a second terminal, and a second contact C5. The first contact C4 of the fourth transistor PG2 is electrically connected to the first terminal of the fourth transistor PG2 and a second bit line BLB, and the shape of the first contact C4 is circular. The control terminal of the fourth transistor PG2 is electrically connected to a second word line WL2. The circle of the first contact C4 of the fourth transistor PG2 includes major axis and minor axis, and the ratio of the major axis and the minor axis is less than 1.2.

In various embodiments, the first terminal of the fifth transistor PD2 is electrically connected to the second terminal of the fourth transistor PG2. The second contact C5 of the fifth transistor PD2 is electrically connected to the second terminal of the fifth transistor PD2 and the ground terminal CVss, and the shape of the second contact C5 is rectangular. In some embodiments, the rectangle of the second contact C5 of the fifth transistor PD2 includes lengths and widths, and the ratio of the length and the width is larger than 3.

In various embodiments, the semiconductor device further includes a sixth transistor PU2. The sixth transistor PU2 includes a first terminal, a second terminal, and a control terminal. The first terminal of the sixth transistor PU2 is electrically connected to the power source CVdd. The second terminal of the sixth transistor PU2 is electrically connected to the first terminal of the fifth transistor PD2, the second terminal of the fourth transistor PG2, and the control terminal of the third transistor PU1. The control terminal of the sixth transistor PU2 is electrically connected to a control terminal of the fifth transistor PD2 and the second terminal of the third transistor PU1. In various embodiments, the transistors PG1, PD1, PU1, PG2, PD2, PU2 are, for example, single fin-line fin field effect transistors (FET). In some embodiments, the semiconductor device in FIGS. 16~17 is, for example, a SRAM.

In some embodiments, a semiconductor device is disclosed that includes a first terminal, a first contact, a second terminal, and a second contact. The first contact is electrically connected to the first terminal, and the shape of the first contact is circular. The second contact is electrically connected to the second terminal and a ground terminal, and the shape of the second contact is rectangular.

Also disclosed is a semiconductor device that includes a first N-type fin field effect transistor (FinFET). The first N-type FinFET includes a drain, a first contact, a first high-K dielectric layer, a source, a second contact, and a second high-K dielectric layer. The first contact is directly connected to the drain, and the shape of the first contact includes circular. The first high-K dielectric layer is disposed around a sidewall of the first contact. The second contact is directly connected to the source and electrically connected to a ground terminal, and the shape of the second contact includes rectangular. The second high-K dielectric layer is disposed around a sidewall of the second contact.

Also disclosed is a semiconductor device that includes a first transistor and a second transistor. The first transistor includes a first terminal, a first contact, a second terminal, and a control terminal. The second transistor includes a first terminal, a second terminal, and a second contact. The first contact of the first transistor is electrically connected to the first terminal and a first bit line, and the shape of the first contact includes circular. The control terminal of the first transistor is electrically connected to a first word line. The first terminal of the second transistor is electrically connected to the second terminal of the first transistor. The second contact of the second transistor is electrically connected to the second terminal of the second transistor and a ground terminal, and the shape of the second contact includes rectangular.

In some embodiments, a semiconductor device includes a substrate, a semiconductor fin, a gate structure, a source structure, a drain structure, a source contact, and a drain contact. The semiconductor fin extends upwardly from the substrate. The gate structure extends across the semiconductor fin. The source structure is on the semiconductor fin. The drain structure is on the semiconductor fin, in which the source and drain structures are respectively on opposite sides of the gate structure in a plan view. The source contact lands on the source structure and forms a rectangular pattern in the plan view. The drain contact lands on the drain structure and forms a circular pattern in the plan view, in which the rectangular pattern of the source contact has a length greater than a longest dimension of the circular pattern of the drain contact. In some embodiments, the semiconductor device further includes a source via landing on the source contact, wherein in the plan view, the source via non-overlaps the semiconductor fin. In some embodiments, the semiconductor device further includes a metal line in contact with the source via and extending along a lengthwise direction of the semiconductor fin, wherein in the plan view, the metal line non-overlaps the semiconductor fin. In some embodiments, the semiconductor device further includes a metal line in contact with the source via and extending along a lengthwise direction of the semiconductor fin, wherein in the plan view, the gate structure overlaps a first longitudinal side of the metal line and non-overlap a second longitudinal side of the metal line opposite to the first longitudinal side. In some embodiments, in a cross section view, a maximal width of the source contact is greater than a maximal width of the source structure. In some embodiments, the source contact has a bottom end in contact with a side surface of the source structure. In some embodiments, the source contact covers a turning corner of the source structure. In some embodiments, in a cross section view, the source contact has a first portion overlapping the source structure and a second portion non-overlapping the source structure, wherein the second portion of the source contact has a bottom surface in a position lower than the first portion of the source contact. In some embodiments, in a cross section view, the source contact has a first portion overlapping the source structure and a second portion non-overlapping the source structure, wherein the second portion of the source contact has a greater height than the first portion of the source contact. In some embodiments, the semiconductor device further includes a drain via landing on the drain contact and a metal line in contact with the drain via and extending along a lengthwise direction of the semiconductor fin, wherein the length of the source contact extends past a longitudinal side of the metal line.

In some embodiments, a semiconductor device includes a substrate, a semiconductor fin, a gate structure, a source structure, a drain structure, a source contact, and a metal line. The semiconductor fin extends upwardly from the substrate. The gate structure extends across the semiconductor fin. The source structure is on the semiconductor fin. The drain structure is on the semiconductor fin, in which the source and drain structures are respectively on opposite sides of the gate structure in a plan view. The source contact lands on the source structure. The metal line has a length extending along a lengthwise direction of the semiconductor fin and overlapping the semiconductor fin, in which the source contact having a length extends past opposite longitudinal sides of the metal line along a lengthwise direction of the gate structure in the plan view. In some embodiments, in the plan view, source contact has a rectangular pattern. In some embodiments, in a cross section view, a maximal width of the source contact is greater than a maximal width of the source structure. In some embodiments, the source contact covers a turning corner of the source structure. In some embodiments, the semiconductor device further includes a drain contact landing on the drain structure, wherein in the plan view, the length of the source contact is greater than a maximal dimension of the drain contact. In some embodiments, the semiconductor device further includes a drain contact landing on the drain structure, wherein in the plan view, the drain contact has a circular pattern.

In some embodiments, a method of forming a semiconductor device includes: forming a semiconductor fin extending upwardly from a substrate; forming a gate structure extending across the semiconductor fin; forming a source structure and a drain structure on the semiconductor fin and on opposite sides of the gate structure in a plan view; forming a source contact landing on the source structure and a drain contact landing on the drain structure; forming a source via landing on the source contact and a drain via landing on the drain contact; and after forming the source and drain vias, forming a metal line in contact with the drain via, wherein the source contact has a length extending past a longitudinal side of the metal line. In some embodiments, forming the source and drain contacts is performed such that in the plan view, the length of the source contact is greater than a maximal dimension of the drain contact. In some embodiments, forming the source and drain contacts is performed such that in the plan view, the source contact forms a rectangular pattern and the drain contact forms a circular pattern. In some embodiments, forming the source contact is performed such that the source contact covers a turning corner of the source structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a semiconductor fin extending upwardly from a substrate;
    forming a gate structure extending across the semiconductor fin;
    forming a source structure and a drain structure on the semiconductor fin and on opposite sides of the gate structure in a plan view;
    forming a source contact landing on the source structure and a drain contact landing on the drain structure;
    forming a source via landing on the source contact and a drain via landing on the drain contact; and
    after forming the source and drain vias, forming a first metal line in contact with the drain via, wherein the source contact has a length extending past a first longitudinal side of the first metal line.

2. The method of claim 1, wherein forming the source and drain contacts is performed such that in the plan view, the length of the source contact is greater than a maximal dimension of the drain contact.

3. The method of claim 1, wherein forming the source and drain contacts is performed such that in the plan view, the source contact forms a rectangular pattern and the drain contact forms a first circular pattern.

4. The method of claim 3, wherein forming the drain via is performed such that in the plan view, the drain via forms a second circular pattern, the first circular pattern of the drain contact enclosing the second circular pattern of the drain via.

5. The method of claim 1, wherein the length of the source contact further extends past a second longitudinal side of the first metal line opposite to the first longitudinal side.

6. The method of claim 1, further comprising:
    after forming the source and drain vias, forming a second metal line landing on the source via, wherein the drain contact non-overlaps the second metal line.

7. The method of claim 1, wherein the source via non-overlaps the semiconductor fin.

8. The method of claim 1, wherein the drain via overlaps the semiconductor fin.

9. A method of forming a semiconductor device, comprising:
    forming a semiconductor fin extending upwardly from a substrate;
    forming a gate structure extending across the semiconductor fin;
    forming a source structure on the semiconductor fin;
    forming a drain structure on the semiconductor fin, wherein the source and drain structures are respectively on opposite sides of the gate structure in a plan view; and
    forming a source contact landing on the source structure and having a rectangular pattern in the plan view, and a drain contact landing on the drain structure and having a circular pattern in the plan view, wherein the rectangular pattern of the source contact has a length greater than a longest dimension of the circular pattern of the drain contact.

10. The method of claim 9, further comprising:
    forming a source via landing on the source contact, wherein in the plan view, the source via non-overlaps the semiconductor fin.

11. The method of claim 10, further comprising:
    forming a metal line in contact with the source via and extending along a lengthwise direction of the semiconductor fin, wherein in the plan view, the metal line non-overlaps the semiconductor fin.

12. The method of claim 10, further comprising:
forming a metal line in contact with the source via and extending along a lengthwise direction of the semiconductor fin, wherein in the plan view, the gate structure overlaps a first longitudinal side of the metal line and non-overlaps a second longitudinal side of the metal line opposite to the first longitudinal side.

13. The method of claim 9, further comprising:
forming a drain via landing on the drain contact and a metal line in contact with the drain via and extending along a lengthwise direction of the semiconductor fin, wherein the source contact extends past a first longitudinal side of the metal line.

14. The method of claim 13, wherein the source contact further extends past a second longitudinal side of the metal line opposite to the first longitudinal side.

15. The method of claim 13, wherein the drain via overlaps the semiconductor fin.

16. A method of forming a semiconductor device, comprising:
forming a semiconductor fin extending upwardly from a substrate;
forming a gate structure extending across the semiconductor fin;
forming a source structure on the semiconductor fin, and a drain structure on the semiconductor fin, wherein the source and drain structures are respectively on opposite sides of the gate structure in a plan view;
forming a source contact landing on the source structure; and
forming a metal line having a length extending along a lengthwise direction of the semiconductor fin and overlapping the semiconductor fin, wherein the source contact having a length extends past opposite longitudinal sides of the metal line along a lengthwise direction of the gate structure in the plan view.

17. The method of claim 16, wherein in the plan view, source contact has a rectangular pattern.

18. The method of claim 16, further comprising:
forming a drain contact landing on the drain structure, wherein in the plan view, the length of the source contact is greater than a dimension of the drain contact along the lengthwise direction of the gate structure.

19. The method of claim 18, further comprising:
forming a drain via on the drain contact, wherein the metal line lands on the drain via.

20. The method of claim 16, further comprising:
forming a drain contact landing on the drain structure, wherein in the plan view, the source contact has a greater profile area than the drain contact.

* * * * *